US012761271B2

(12) United States Patent
Lo et al.

(10) Patent No.: US 12,761,271 B2
(45) Date of Patent: Oct. 13, 2026

(54) METHOD FOR ADJUSTING THE POSITION OF PROBING BASE AND PROBING MACHINE USING THE SAME

(71) Applicant: MPI Corporation, Zhubei City (TW)

(72) Inventors: Ya-Hung Lo, Zhubei City (TW); Chien-Hsun Chen, Zhubei City (TW); Shou-Jen Tsai, Zhubei City (TW); Fuh-Chyun Tang, Zhubei City (TW)

(73) Assignee: MPI Corporation, Zhubei City (TW)

( * ) Notice: Subject to any disclaimer, the term of this patent is extended or adjusted under 35 U.S.C. 154(b) by 224 days.

(21) Appl. No.: 18/672,151

(22) Filed: May 23, 2024

(65) Prior Publication Data

US 2024/0393386 A1 Nov. 28, 2024

(30) Foreign Application Priority Data

May 24, 2023 (TW) ................................ 112119415

(51) Int. Cl.
*G01R 31/28* (2006.01)

(52) U.S. Cl.
CPC ..... *G01R 31/2887* (2013.01); *G01R 31/2808* (2013.01)

(58) Field of Classification Search
CPC ........................ G01R 31/2887; G01R 31/2808
See application file for complete search history.

(56) References Cited

U.S. PATENT DOCUMENTS

| | | | | |
|---|---|---|---|---|
| 5,642,432 A * | 6/1997 | Mori | G01R 1/06705 | 382/145 |
| 6,208,375 B1 * | 3/2001 | Kay | G01R 1/06705 | 348/95 |
| 6,794,889 B2 * | 9/2004 | Jafari | G01R 31/2886 | 324/750.25 |
| 2024/0319229 A1 * | 9/2024 | Kim | G01R 31/2891 | |

* cited by examiner

*Primary Examiner* — Walter L Lindsay, Jr.
*Assistant Examiner* — Milton Gonzalez
(74) *Attorney, Agent, or Firm* — Troutman Pepper Locke LLP; Tim Tingkang Xia, Esq.

(57) ABSTRACT

A method for adjusting position of probing base comprises steps of providing a probing machine comprising a probing holder, a first probing base having a first probing needle comprising a plurality of first probing bodies wherein two adjacent tips of the first probing bodies h a first pitch, and a second probing base having a second probe comprising a plurality of second probing bodies in which two adjacent tips of the second probing bodies has a second pitch, thereafter, grabbing the first probing base and connecting the first probing base to the probing holder, acquiring first image with respect to the plurality of first probing bodies through visual identification module, and finally, adjusting roll angle of probing tips of the plurality of first needle bodies according to the first image. Alternatively, the present invention further provides a probing machine using the method for testing DUTs having different pitches.

12 Claims, 9 Drawing Sheets

METHOD FOR ADJUSTING THE POSITION OF PROBING BASE AND PROBING MACHINE USING THE SAME

RELATED APPLICATIONS

This application claims the benefit of Taiwan Patent Application Serial 112119415, filed May 24, 2023, the subject matter of which is incorporated herein by reference.

BACKGROUND OF INVENTION

1. Field of the Invention

The present invention is related to a probing technology, and, more particularly, to a method for adjusting the position of probing base and probing machine for detecting electrical characteristics of a device under test (DUT) having different pitch of contact pads.

2. Description of the Prior Art

Due to the miniaturization of electronic components, it is necessary to test the function of signal transmission after the semiconductor manufacturing process to ensure the quality of electronic components. In general, when it comes to test the electrical connections between various electronic components in electronic products or to check whether signal transmission is normal or not, the probing machine is typically utilized to analyze the electrical signals and perform signal transmission tests on the DUT.

The conventional inspection equipment for probing test generally includes probe devices and signal testing machines, which are utilized to perform electrical testing on the DUT. In general, for the same DUT, such as a packaged carrier board or a printed circuit board (PCB), for example, there may exist issues that different pitches are formed between the testing contact pads in the same DUT. Therefore, different pitch of contact pads on the DUT requires corresponding probing base for inspection. Therefore, there is a need for developing a detachable probing base having specific pitch of needle tip, and the detachable probing base can be automatically changed according to the pitch of contact pads formed on the DUT.

However, when one probing base is replaced with another probing base having different pitch from the pitch of replaced probing base, in certain scenario of inspection according to different type of probing needles, it is desirable that the probing needle tips can be positioned at optimal range of measurement for probing the DUT. After replacing the probing base, if the position of the probing needle tip cannot be rotatably adjusted to the required location, it may result in the inability to contact the pads on the DUT or lead to poor contact, potentially causing issues such as no electrical signal or signal instability.

Accordingly, there is a need for providing a method for adjusting the position of the probing base and probing machine using the same.

SUMMARY OF THE INVENTION

During the electrical testing of packaging substrates or printed circuit boards, there is a further need for specific frequency testing. Therefore, it is necessary to use probing needles with impedance matching such as, one end of a coaxial copper tube is connected to the needle body, or a circuit with impedance matching using a printed circuit board is connected to the needle body, for example for testing DUT. Hence, there is a need for designing probing bases with different pitches of needle tip and impedance matching for different pitches of contact pads formed on the substrate or PCB. Furthermore, the probing needles utilized for testing can adopt a structure with impedance matching and then extend to the needle body conforming to the pitches of the contact pads such as, a coaxial copper tube or a printed circuit board with impedance matching circuits connected to the needle body, for example. Conventionally, the probing needles designed with impedance matching for different pitches of contact pads are integrated with the impedance matching structure through connecting measure such as welding, for example, which causes the pitch between needle bodies incapable of being adjusted. Even if the pitch of needle tip is adjusted, the overall impedance matching of the probing needle will be changed.

In order to solve the above-mentioned issues, the present invention provides a method for adjusting the position of the probing base and probing machine for ensuring stable signal during testing the DUT, and maintaining measurement stability and data accuracy thereby measurement accuracy can be stably kept for different probing needles having various tip pitches.

In one embodiment, the present invention provides a method for adjusting position of probing base, comprising steps of providing a probing machine comprising a probing holder, a first probing base, and a second probing base, wherein the first probing base and the second probing base are positioned in a probing base placing part, the first probing base comprises a first probing needle comprising a plurality of first probing needle bodies, wherein needle tips of two adjacent first probing needle bodies have a first pitch, and the second probing base comprises a second probing needle comprising a plurality of second probing needle bodies, wherein needle tips of two adjacent second probing needle bodies have a second pitch, connecting the probing holder to the first probing base when the first probing base is grabbed, enabling a relative motion between a vision identification module and the probing holder such that the probing holder is moved within the field of view of the vision identification module, capturing a first image of the plurality of the first probing needle bodies through the vision identification module wherein the needle tips of the plurality of first probing needle bodies are captured within the first image; and adjusting position of the first probing base according to the first image so as to adjust the roll angle of the needle tips of the plurality of first probing needle bodies.

Through the aforementioned method, after selecting a probing holder with an appropriate pitch of probing needle, and completing the replacement of selected probing holder, the vision identification module identifies the roll angle status of needle tips of needle bodies according to the first image. Subsequently, the adjustment mechanism is utilized to adjust the roll angle of the needle tips whereby the needle tips of the plurality of needle bodies on the probing holder can be aligned to contact with the contact pads of DUT thereby achieving the effect of automatic adjustment of roll angle of needle tips.

Furthermore, the reason that the vision identification module matches with roll angle of the needle tips adjusted by the adjustment mechanism is for complying with the requirement of probe tip leveling of the needle tips of impedance matching probing needles thereby ensuring compliance with various testing specifications for different types of probing needles and signal stability of DUT during the signal test. For example, in case of a process that probing bases with different pitches of needle tip are connected to the probing holder of the probing machine may lead to probe tip leveling of the needle tips failing to comply with the testing specifications. Therefore, a method for adjusting the position of the probing base is required when the probing base connected to the probing holder is replaced.

With the dimension of the DUT decreases, the dimensions of the contact pads on the DUT are also reduced thereby resulting in a decrease of the pitch between contact pads. In order to test smaller-sized DUT, the dimensions of each needle tip on the probing base are also scaled down. Consequently, the load sensitivity that the needle tips of the probing needles is also increased. If the load is not properly controlled, the variation of the load exerted on the probing needles could easily lead to damage the needle tips or contact pads when the probing needles are moved down to contact the contact pads. To prevent damage to the probing needle or the contact pads, a precise control of the needle pressure and load applied to the DUT is necessary. Therefore, when replacement of probing bases is occurred, additional challenges including precise control of load test and conversion should be overcome.

In one embodiment, the probing machine also comprises a load measuring device. The method for adjusting the position of the probing base further comprises step of adjusting the roll angle of the needle tips of the plurality of first probing needle bodies using an adjustment mechanism. Afterward, the probing holder is moved relatively to the load measuring device whereby the needle tips of the plurality of the first needle bodies contact with the load measuring device thereby generating a load information correspondingly.

Through previously described measure of this embodiment, the load that probing needles exert on the contact pads of DUT can be accurately controlled, thereby preventing the probing needles or contact pads of DUT from being damaged. Furthermore, when probing base is replaced, it is necessary to adjust the roll angle of the needle tips in advance and then perform a precise load control of the probing needle.

In one embodiment, through the aforementioned method of generating load information by the load measuring device, the first probing base comprises a cantilever arm with a pressure sensor formed thereon. The method for adjusting the position of the probing holder further comprises step of generating electrical information by the pressure sensor when the load measuring device generates load information. This load information and the electrical information are then transmitted to a processing unit electrically coupled to the load measuring device and the pressure sensor, wherein the processing unit establishes a correlation between the load information and the electrical information.

Through the previously described measure of the embodiment, when the probing base is replaced, it is necessary to adjust the roll angle of the need tips and then perform a precise control with respect to the load and needle pressure.

In one embodiment, the method for adjusting the position of the probing base further comprises providing a supporting platform on which the probing base placing part and the vision identification module are arranged wherein the supporting platform further comprises an testing area for placing the DUT, and the load measuring device is arranged in the probing base placing part or is arranged between the probing base placing part and the testing area.

Through the method of this embodiment that the load measuring device is arranged in the probing base placing part or between the probing base placing part and the testing area, it indicates that, after the roll angle of the needle tips is adjusted, the load calibration can be promptly conducted so as to save required time of relative movement between the probing holder and the supporting platform, thereby improving utilization.

In one embodiment of the method for adjusting the position of the probing base, the adjustment of the roll angle of the needle tips comprises step of moving the first probing base along a curved surface wherein a plurality of the first needle bodies are located within an inner arc region of the curved surface.

Through the method of this embodiment, when the adjustment mechanism rotates the probing base for adjusting the roll angle of the needle tip through a sliding movement on the inner arc region of the curved guide rail so as to prevent the probing needle from being out of the image-acquiring field, such as FOV, of the image-acquiring module of vision identification module during the adjustment. This is also capable of avoiding the need to spend time locating the probe position during the adjustment, thereby enhancing the efficiency of adjusting the roll angle of the probing needle.

In one embodiment for adjusting the position of the probing base, it further comprises rotating the first probing base by a specific angle after the probing holder is connected to the first probing base such that the first probing base is in the imaging field, such as FOV, of the vision identification module.

Alternatively, through the present embodiment during the process for acquiring image of the needle tip, the probing holder is capable of rotating by a specific angle, particularly the specific angle rotating about the Z axis, so as to prevent the vision identification module form being interfered or to allow the probing needle facing the vision identification module, whereby the vision identification module can acquire the first image of the needle tip.

The present invention provides a probing machine with replaceable probing base, comprising a probing base placing part, a probing holder, a vision identification module, and adjustment mechanism for adjusting probe tip leveling. The probing base placing part is utilized to store a first probing base and a second probing base. The first probing base comprises a first probing needle comprising a plurality of first needle bodies wherein a first pitch is defined between needle tips of any two of adjacent first needle bodies. The second probing base comprises a second probing needle comprising a plurality of second probing bodies, wherein a second pitch is defined between needle tips of any two adjacent second needle bodies. When the probing holder grabs the first probing base, the probing holder is connected to the first probing base utilized to detect electrical characteristics of the DUT. The vision identification module is utilized to acquire a first image with respect to needle tips of the first probing bodies after the probing holder is connected to the first probing base, and generates a control signal according to the first image. The adjustment mechanism receives the control signal for adjusting roll angle of the needle tips of the plurality of first needle bodies of the first probing base.

Through the above-mentioned design, the probing machine can test DUT having different pitches of contact pads by automatically replacing probing base having different pitch of needle tips, such as the probing holder grabs and connects to the first probing base, for example. After replacing the probing base, the vision identification module can identify the probe tip leveling of the needle tips of the needle bodies according to the first image, and adjust probe tip leveling of the needle tips of the needle bodies through the adjustment mechanism such that the needle tips of the needle bodies of the probing base can completely touch the contact pads of the DUT thereby achieving effect of automatically adjusting roll angle of the needle tips. Moreover, the purpose that vision identification module assists the adjustment mechanism to adjust the roll angle of needle tips is to meet the alignment requirement of the needle tip of the impedance-matching probe thereby complying with different testing specification corresponding to different probing needles.

As the size of the DUT decreases, the size of the contact pads on the DUT also decreases, resulting in a reduction in the spacing between the contact pads. In order to test the downsized DUT, the size of each needle tip on the probing base is also reduced. As a result, the sensitivity of the needle tips toward force exerting thereon is increased. If the force applied to the probing needle is not properly controlled, during the process of downwardly probing, it's easy to exceed the critical threshold of the pressure that the probing needle can afford, thereby resulting in damage on the probing needle or the contact pads of the DUT. In order to prevent damage on the probing needle or the DUT, the load that probing needle exerting on the DUT needs to be precisely controlled. Therefore, when replacing the probing base, further efforts are required to overcome issues such as testing load of probing needle, load conversion, and so on.

In one embodiment, the probing machine further comprises a load measuring device, wherein after the adjustment mechanism adjusts the roll angle of needle tips of the plurality of first probing needle bodies, the plurality of first needle bodies are moved to contact the load measuring device thereby generating a load information by the load measuring device.

In one embodiment, the first probing base of the probing machine comprises a cantilever arm having a pressure sensor arranged thereon. When the load information is generated by the load measuring device, and the electrical information is generated by the pressure sensor, both load information and the electrical information are transmitted to a processing unit electrically coupled to the pressure sensor and the load measuring device. Thereafter, the processing unit correlates the load information with the electrical information.

Through the measure provided in this embodiment, it is possible to accurately control the force which the probing needle touches the contact pads of the DUT during downward probing, thereby achieving the effect of preventing damage on the probing needle or the DUT.

In one embodiment, the probing machine further comprises a supporting platform for supporting the probing base placing part and the vision identification module. The supporting platform further comprises a testing area for supporting the DUT, wherein the load measuring device is arranged on the probing base placing part, or is arranged between the probing base placing part and the testing area.

Through the measure of the above-mentioned embodiment, the probing holder is capable of performing probe tip leveling adjustment, and then the load measuring device is utilized to perform load test. When the probe tip leveling of the needle tips is adjusted to the position meet the testing requirement, the load test is then performed so as to achieve the objective that save the relative moving time between the probing holder and the supporting platform, thereby improving the utilization of the probing machine.

In one embodiment, the adjustment mechanism for adjusting the probe tip leveling is arranged on the probing holder, and further comprises a driving unit, a holding part, and a moving part. The holding part is arranged on the probing holder, and comprises a curved guide rail. One side of the moving part is slidably coupled to an arc region of the curved guide rail, while the other side of the moving part is connected to the first probing base. The moving part is also coupled to the driving unit for receiving a power outputted from the driving unit so as to slide on the curved guide rail through the power thereby adjusting the position of the first probing base.

Through the measure of the above-mentioned embodiment, the adjustment mechanism slides on the inner arc region of the curved guide rail; therefore, during the process of adjusting the probe tip leveling of the needle tips, the XY position of the needle tips can be kept near curve center of the curved guide rail, wherein the curve center is relative to the XY position of the image acquiring module of the vision identification module such that the effect that the XY position of the needle tips can be kept within the field of view of the image acquiring module of the vision identification module can be achieved.

In one embodiment, the vision identification module of the probing machine further comprises image acquiring module and identification module, wherein the image acquiring module is utilized to acquire a first image of the needle tips, while the identification module is electrically coupled to the image acquiring module and the adjustment mechanism. The identification module receives the first image and generates a control signal according to the bias angle with respect to the needle tips of the plurality of first needle bodies through identifying the first image.

Through the embodiment of the present invention, the vision identification module can recognize the bias angle of the needle tips of the needle bodies, such that the adjustment mechanism can adjust the roll angle of the first probing base according the identified bias angle described previously.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
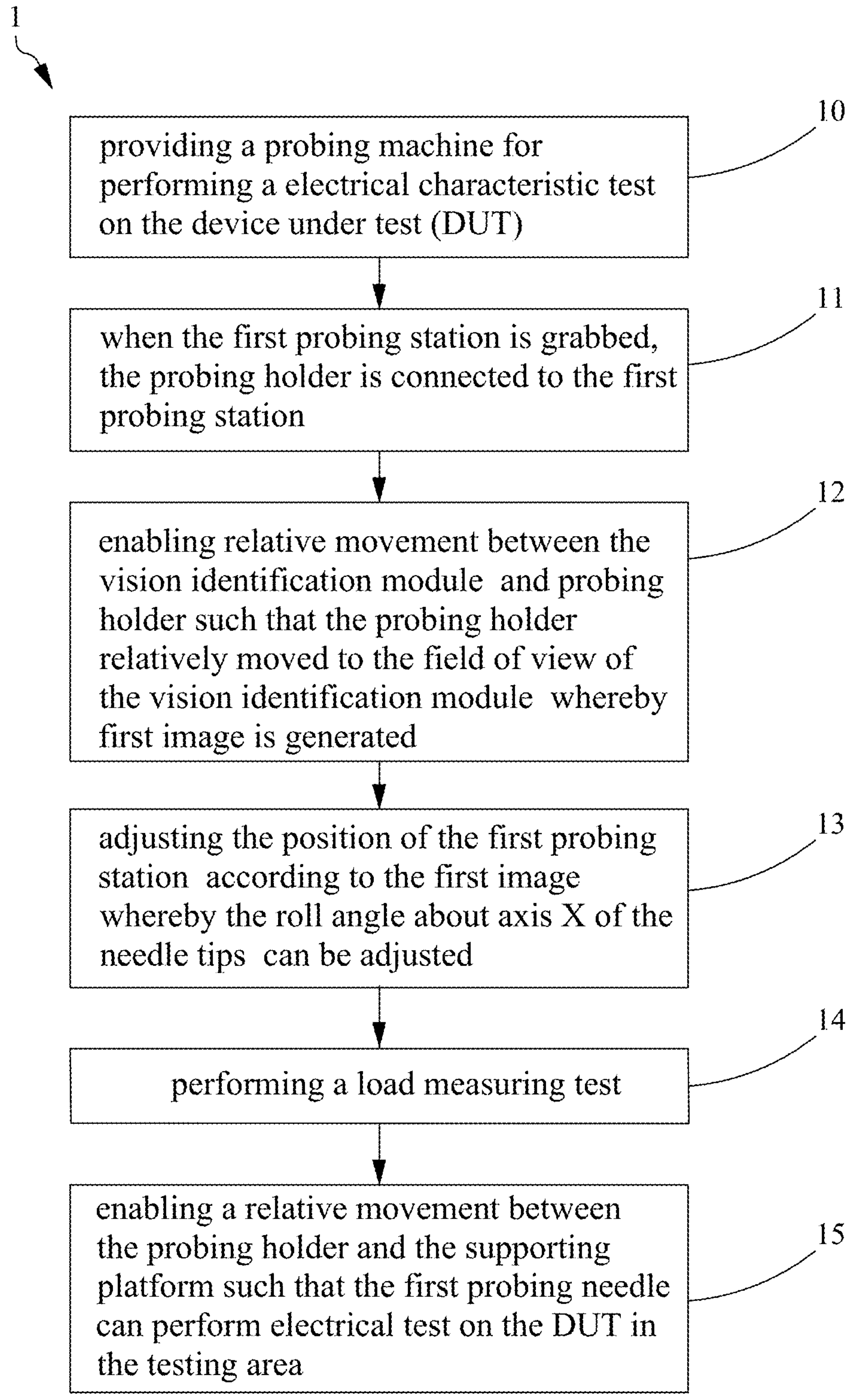
FIG. 1 illustrates a flow of method for adjusting position of probing base according to one embodiment of the present invention.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure. In addition, the terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 2A:
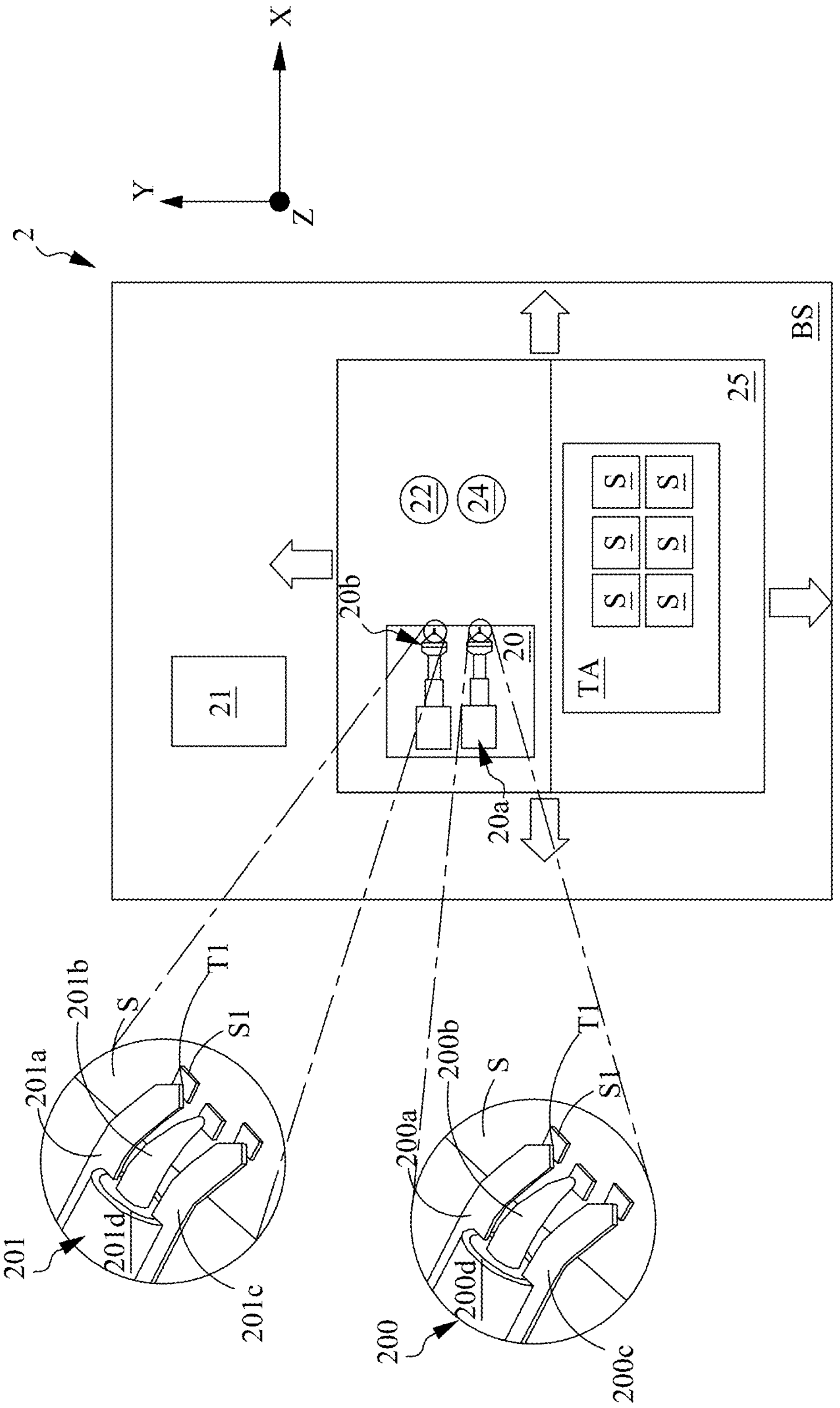
FIG. 2A illustrates a probing machine according to one embodiment of the present invention.
Figure 2B:
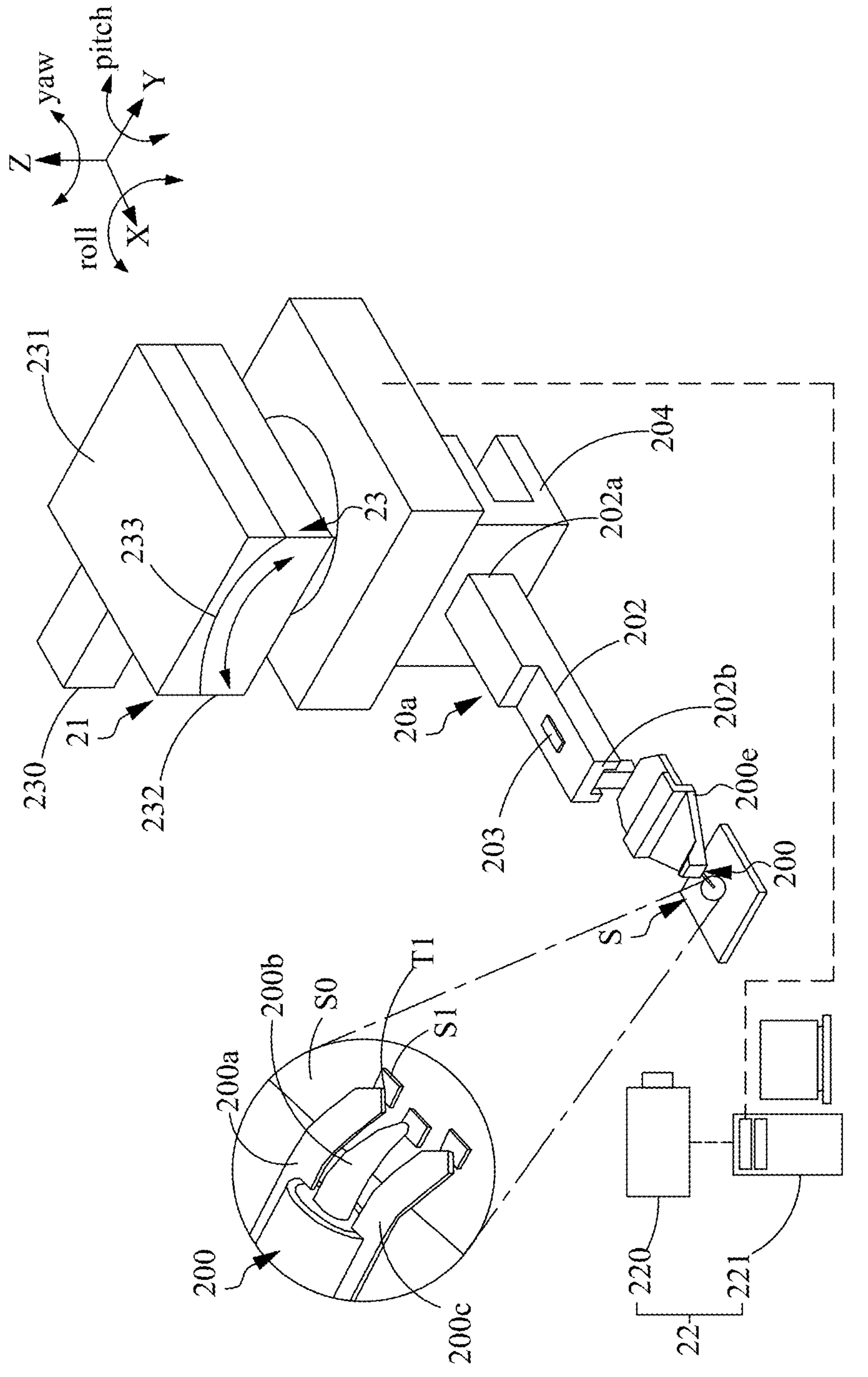
FIG. 2B illustrates one embodiment that the probing holder grabs the first probing base.

Please refer to FIG. 1, which illustrates method for adjusting the position of the probing base according to one embodiment of the present invention, and FIGS. 2A and 2B, wherein FIG. 2A refers to probing machine capable of changing the probing base according to one embodiment of the present invention, while FIG. 2B refers to an illustration that the probing holder grabs the first probing base. The method 1 is proceeded by step 10 of providing a probing machine 2 for performing a electrical characteristic test on the device under test (DUT) S. In the present embodiment, the probing machine 2 comprises foundation base BS having probing base placing part 20 arranged thereon, probing holder 21, vision identification module 22, adjustment mechanism 23 for adjusting horizontal level, load measuring device 24, and supporting platform 25. The probing base placing part 20 is utilized to allow a plurality of probing bases arranged thereon, wherein the plurality of probing bases are utilized to perform electrical characteristic test through touching the contact pads having different pitches. In the embodiment shown in FIG. 2A, the first probing base 20*a* and the second probing base 20*b* are utilized to explain the method. The first probing base 20*a* comprises a first probing needle 200 having a plurality of first needle bodies 200*a*~200*c*, wherein a first pitch is formed between the needle tips T1 of any two adjacent first needle bodies 200*a*, 200*b*, and 200*c*. The end part of each first needle body 200*a*~200*c* is connected to an impedance-matching structure 200*d*, such as coaxial copper tube or printed circuit board (PCB) having impedance-matching with the first needle bodies 200*a*~200*c*. In the present embodiment, the impedance-matching structure 200*d* is coaxial copper tube such that the first probing needle 200 possesses impedance-matching feature. Taking the first probing needle 200 shown in FIG. 2A as one example, the first probing needle 200 is radio frequency (RF) probing needle.

Likewise, the second probing base 20*b* also comprises a second probing needle 201 having a plurality of second needle bodies 201*a*~101*c*, wherein a second pitch is formed between the needle tips T1 of any two adjacent second needle bodies 201*a*, 201*b*, and 201*c*. The end part of each second needle body 201*a*~201*c* is connected to an impedance-matching structure 201*d*, such as coaxial copper tube or printed circuit board (PCB) having impedance-matching with the second needle bodies 201*a*~201*c*. In the present embodiment, the impedance-matching structure 201*d* is coaxial copper tube such that the second probing needle 201 possesses impedance-matching feature. Taking the second probing needle 201 shown in FIG. 2A as one example, the second probing needle 201 is radio frequency (RF) probing needle. In one embodiment, the first needle bodies 200*a*~200*c* and the second needle bodies 201*a*~201*c* are formed by metal material. In addition, it is noted that the quantity of the first and second needle bodies is not limited to the quantity shown in FIG. 2A. There are at least two first needle bodies, or at least two second needle bodies. Furthermore, in the present embodiment, even if the manufacturing error are existed in the first pitch defined by the needle tips of at least two first needle bodies of the first probing needle 200 shown in FIG. 2A, such as the needle tips T1 of the first needle bodies 200*a* and 200*b*, and the needle tips T1 of the first needle bodies 200*b* and 200*c*, it still comply with the requirement range of first pitch if the first pitch can meet the pitch between contact pads formed on the DUT. Likewise, even if the manufacturing error are existed in the second pitch defined by the needle tips of at least two second needle bodies of the second probing needle 201 shown in FIG. 2A, such as the needle tips T1 of the second needle bodies 201*a* and 201*b*, and the needle tips T1 of the second needle bodies 201*b* and 201*c*, it still comply with the requirement range of second pitch if the second pitch can meet the pitch between contact pads formed on the DUT.

In the embodiment shown in FIG. 2A, according to the virtual coordinate system XYZ associated with the foundation base BS, the XY axes refer to the two-dimensional axes associated with the movement plane of the supporting platform 25, and Z axis refers to the lifting direction of the supporting platform 25. The supporting platform 25 is utilized to support at least one DUT(S). In the present embodiment, the DUT(S) is a package substrate or PCB, on which a plurality of contact pads having different pitches are formed. In addition, the supporting platform 25 in the present invention is capable of moving on the plane formed by the XY axes. In the present embodiment, the probing base placing part 20, vision identification module 22 and load measuring device 24 are arranged on the supporting platform 25. The supporting platform 25 comprises testing area TA for supporting the DUT(S), wherein the load measuring device 24 is arranged on the probing base placing part 20 or is arranged between the probing base placing part 20 and the testing area TA. It is noted that the arranged position of vision identification module 22 and load measuring device 24 can be determined according to utilization rate and moving path, which is not limited by the embodiment shown in the drawings. In one embodiment, as shown in FIG. 2A, the load measuring device 24 is arranged between the vision identification module 22 and testing area TA.

Please refer to FIG. 1 and FIG. 2A, in which the step 11 is performed after step 10, through a relative movement between the probing holder 21 and the probing base placing part 20, when the first probing base 20*a* is grabbed by the probing holder 21, the probing holder 21 is connected to the first probing base 20*a*. It is noted that, in the step 11, it is not limited to grab the first probing base 20*a* or the second probing base 20*b*. However, in the present embodiment, the probing holder 21 grabbing the first probing base 20*a* is utilized as one exemplary example for explanation. Through the relative movement between the probing holder 21 and the probing base placing part 20, when the first probing base 20*a* is grabbed, the probing holder 21 is connected to the first probing base 20*a*. It is noted that, in the step 11, the way for grabbing the first probing base 20*a* is not specific limited. In one embodiment, the probing holder 21 directly grabs the first probing base 20*a*. In addition, in one alternative embodiment, it is also available to grab the first probing base 20*a* through another robotic arm, and then is connected to the probing holder 21. Moreover, it is noted that the relative movement in step 11 is that the probing holder 21 moves to the probing base placing part 20 through two-dimensional motion in XY plane, or supporting platform 25 is controlled to move through two-dimensional motion in XY plane whereby the relative position between the probing holder 21 and probing base placing part 20 can be changed, or the probing holder 21 and supporting platform 25 can be controlled to move through two-dimensional motion in XY plane simultaneously so as to change the relative position between the probing holder 21 and probing base placing part 20. In the present embodiment, the relative position between the probing holder 21 and probing base placing part 20 is changed by the two-dimensional movement of supporting platform 25 in the XY plane such that the probing holder 21 moves to the position corresponding to the position of the first probing base 20*a* and then grabs the first probing base 20*a* through translation movement along Z axis.

Figure 2C:
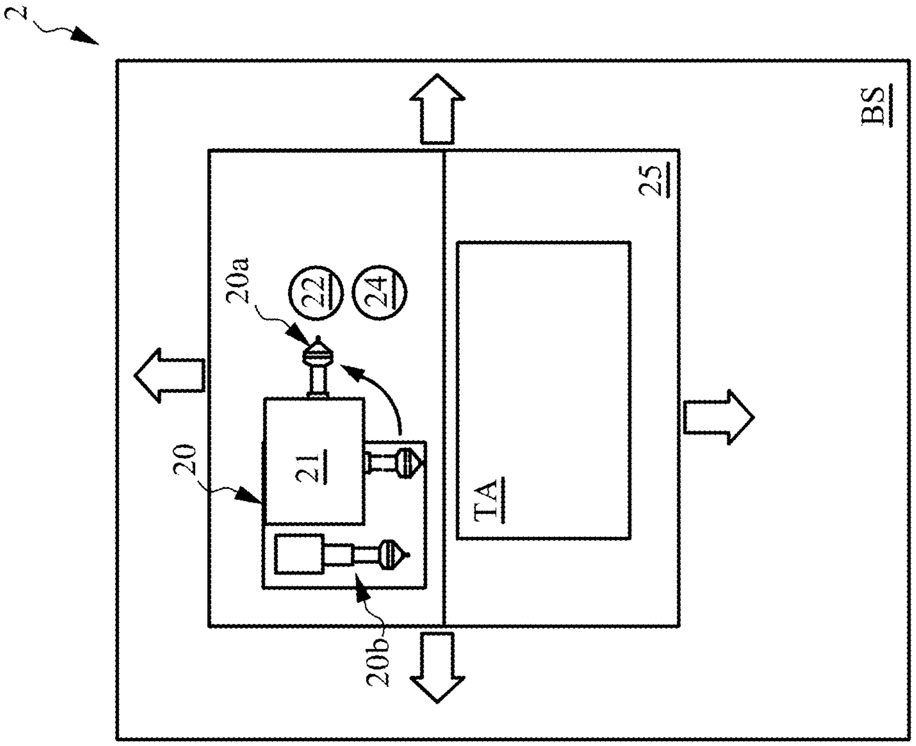
FIG. 2C illustrates one embodiment that the probing holder grabs and rotates the first probing base.

After the probing holder 21 grabs the first probing base 20*a*, the step 12 is performed to enable relative movement between the vision identification module 22 and probing holder 21 such that the probing holder 21 relatively moved to the field of view (FOV) of the vision identification module 22 whereby the vision identification module 22 can acquire first image of the plurality of the first needle bodies wherein the needle tips of the plurality of the first needle bodies are in the first image. In one embodiment, the vision identification module 22 is arranged on the supporting platform 25 such that the probing holder 21 can be moved to the FOV of the vision identification module 22 through relative motion on XY plane. In one alternative embodiment, the supporting platform 25 is controlled to perform two-dimensional motion of XY axes so as to change the relative position between the probing holder 21 and vision identification module 22. In other alternative embodiment, the probing holder 21 and supporting platform 25 can both perform two-dimensional movement such that the relative position between the probing holder 21 and vision identification module 22 can be changed through moving the probing holder 21 and vision identification module 22 simultaneously. In addition to the movement of XY axes, in another embodiment shown in FIG. 2C, the relative movement further comprises rotating the first probing base 20*a* or probing holder about the Z axis by a specific angle such that the first probing base 20*a* or probing holder 21 can be moved to the FOV of the vision identification module 22. It is noted that the rotation about Z axis can prevent the vision identification module 22 from the interruption of other mechanism, or enable the needle tips of the probing base grabbed by the probing holder 21 facing the vision identification module 22 such that the vision identification module 22 can acquire the first image of the needle tips of the plurality of first needle bodies.

In one embodiment with respect to the step 12 shown in FIG. 2B, the vision identification module 22 further comprises image acquiring module 220 and identification module 221, wherein the image acquiring module 220 includes, but not be limited to, CCD and CMOS, and the identification module 221 is a computer having operating and processing capability. In one embodiment, the imaging acquiring module 220 is arranged on the supporting platform 25 for acquiring the first image with respect to the needle tips T1. The identification module 221 is electrically connected to the image acquiring module 220 and adjustment mechanism 23. The identification module 221 can be arranged on the supporting platform 25 or the identification module 221 is externally connected to the computer and be electrically connected to the image acquiring module 220 arranged on the supporting platform 25.

After acquiring the first image, the step 13 is performed to adjust the position of the first probing base 20*a* according to the first image whereby the roll angle of the needle tips T1 of the first needle bodies 200*a*~200*c* can be adjusted. Please refer to the FIG. 2B, it is noted that in the six-axis coordinate system including X axis, Y axis Z axis, and counterclockwise or clockwise rotation about X, Y and Z axes, the counterclockwise or clockwise rotation about X axis is defined as roll, the counterclockwise or clockwise rotation about Y is defined as pitch and the counterclockwise or clockwise rotation about Z is defined as yaw. In the present embodiment, the roll angle is defined as counterclockwise or clockwise rotation about X axis of the needle tips shown in FIG. 2B. In one embodiment of the step 13, the identification module 221 receives the first image and generates control signal according to the bias angle of the needle tips T1 of the plurality of the first needle bodies 200*a*~200*c* such that the adjustment mechanism receives the control signal and generates adjusting movement for adjusting the roll angle of the needle tips T1. The way for adjusting roll angle of the probing needle is explained below. Firstly, the embodiment of the mechanism is explained. In the present embodiment shown in FIG. 2B, the probing holder 21 performs at least one dimensional linear movement according to the operation need. In one embodiment of the linear movement shown in FIG. 2A, it refers to the lifting movement along the Z axis. In addition to the lifting movement along Z axis, alternatively, the probing holder 21 can also perform movement with respect to X and Y axes. Furthermore, in one embodiment, the probing holder 21 further comprises adjustment mechanism arranged thereon for adjusting the probe tip leveling of the needle tips. After the adjustment mechanism receives the control signal, the needle tips of the plurality of probing needle arranged on the probing base grabbed by the probing holder can be adjusted. For example, in the embodiment shown in FIG. 2B, the probing holder 21 grabs the first probing base 20*a*, and the adjustment mechanism 23 is utilized to adjust the roll angle of the needle tips T1 of the plurality of first needle bodies 200*a*~200*c*.

Figure 3A:
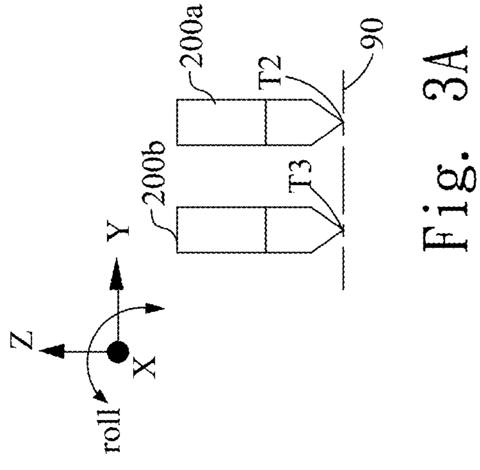
FIG. 3A illustrates an alignment position of the needle tips according to one embodiment of the present invention.
Figure 3B:
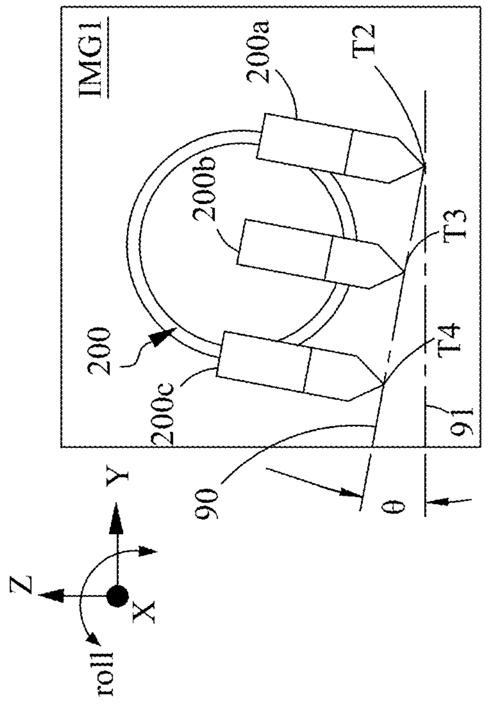
FIGS. 3B and 3C illustrates an operation of adjusting roll angle according to one embodiment of the present invention.

Next, the way for adjusting probe tip leveling is explained below. The specification of probe tip leveling is varied with the type of the probing needle. For example, in the embodiment shown in FIG. 3A, the needle tip T2 and T3 of the probing needles are at the same probe tip leveling, e.g. the needle tips aligned along a virtual line 90. In addition, in one alternative embodiment, the height difference is existed between the needle tips T2 and T3. The DUT is tested according to the specification with respect to the needle tips of the probing needles. It is noted that the virtual line 90 is an imaginary line for explaining the roll angle of the needle tips T2 and T3, and it is not a line of real existence. In the embodiment shown in FIG. 3B, after the identification module 221 identifies the acquired first image IMG1, the virtual line 90 constituted by the needle tips T2~T4 of the first needle bodies 200*a*~200*c* of the first probing needle 200 having a bias angle θ comparing with the standard line 91 can be identified. Thereafter, the identification module 221 generates the control signal and transmits the control signal to the adjustment mechanism 23 according to the bias angle θ. Please refer to FIG. 3C, the adjustment mechanism adjusts the roll angle of the virtual line 90 constituted by the needle tips T2~T4 of the first needle bodies 200*a*~200*c* of the first probing needle according to the control signal, i.e., enabling the virtual line 90 constituted by the needle tips T2~T4 aligned with the standard line 91 through adjusting roll angle. It is noted that the alignment through the virtual line 90 described previously is not the only way. For example, in another embodiment, the first image IMG1 can be utilized to compare with the standard image corresponding to needle tips having standard horizontal position thereby generating the control signal according to the bias angle θ and transmitting the control signal to the adjustment mechanism 23.

In one embodiment shown in FIG. 2B, the adjustment mechanism 23 is arranged on the probing holder 21 and the adjustment mechanism 23 further comprises a driving unit 230, a holding part 231 and moving part 232. The driving unit 230, such as the motor, is utilized to provide power. The holding part 231 is arranged on the probing holder 21, on which a curved guide rail 233 is arranged. One side of the moving part 232 is slidably connected to the inner arc region of the curved guide rail 233 while the other side of the moving part 232 is connected to the first probing base 21. The moving part 232 is coupled to the driving unit 230 for receiving power outputted by the driving unit 230 and slides on the curved guide rail 233 thereby adjusting the position of the first probing base 20*a*.

Figure 3C:
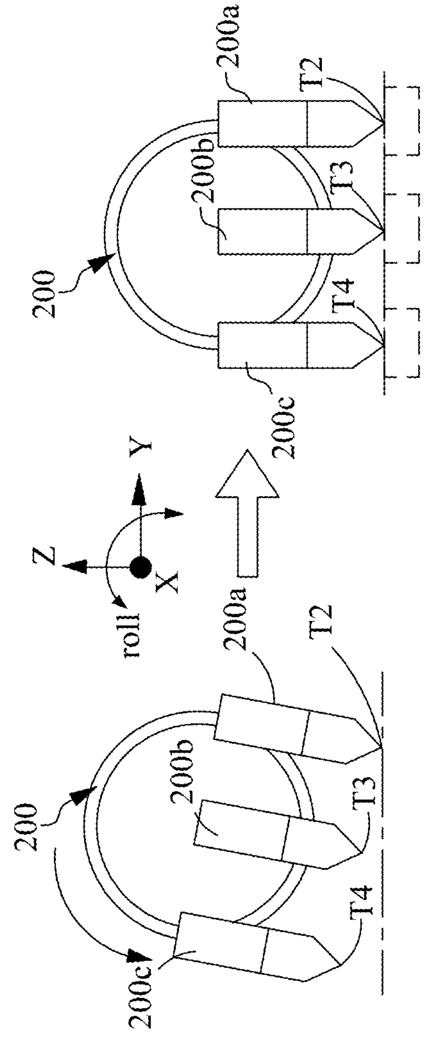
Figure 4B:
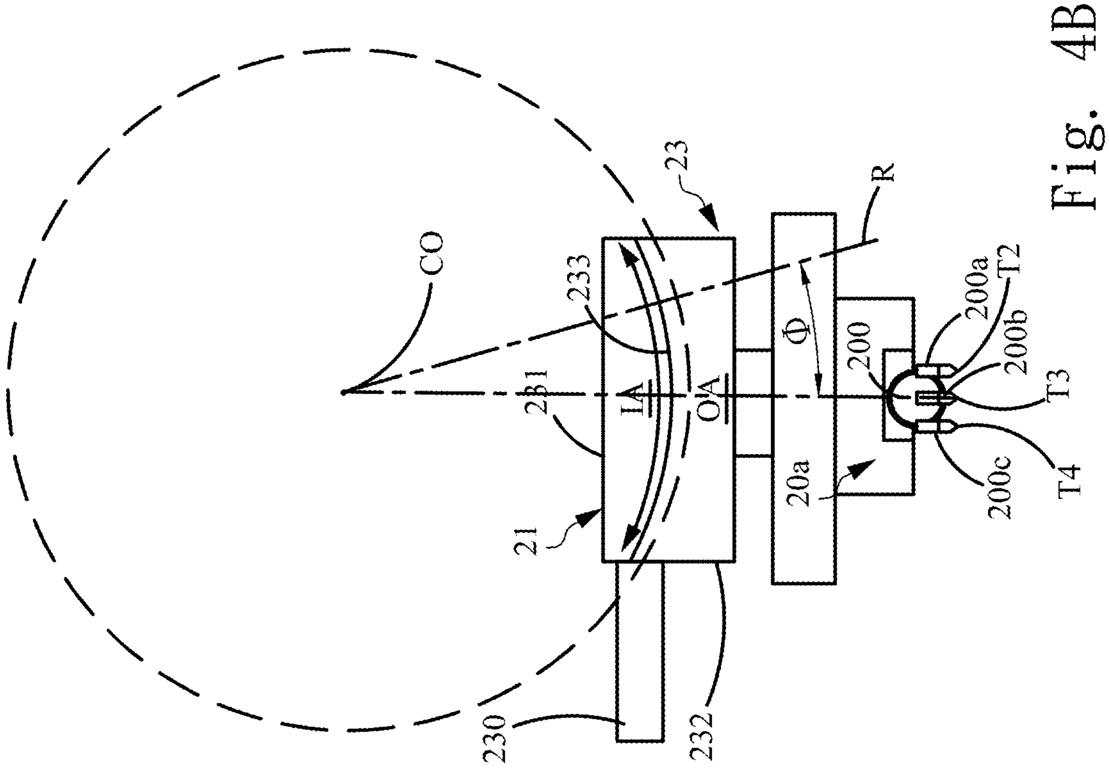
FIGS. 4A and 4B illustrates an operation of curved guide rail according to one embodiment of the present invention.
Figure 4A:
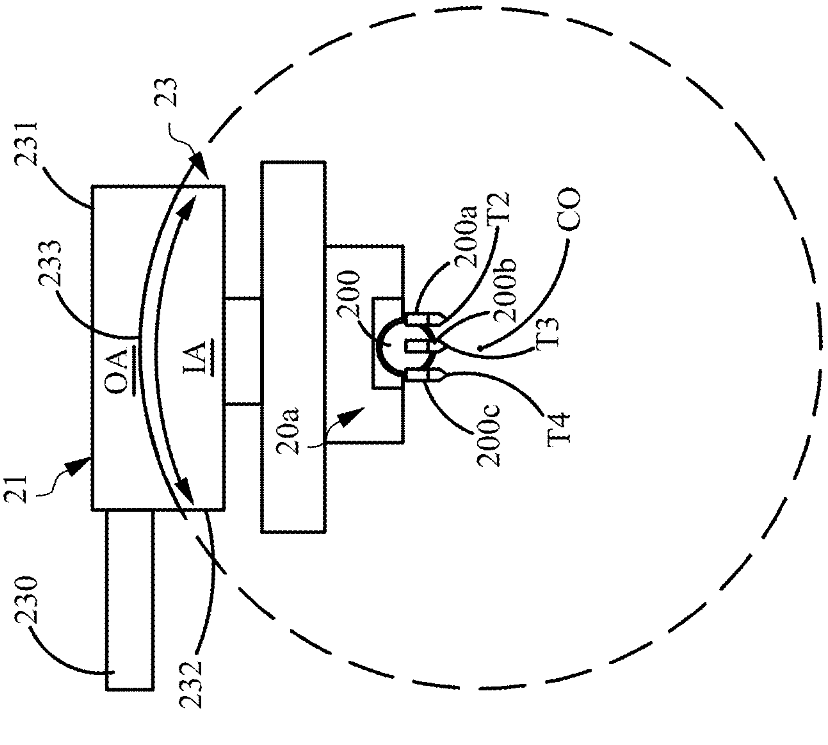

Next, the operation way of the curved guide rail 233 is explained as FIG. 4A which illustrates the operation of the curved guide rail. In the FIG. 4A, the probing holder 21 shown in FIG. 4A is a front view of the probing holder 21 associated with XY axes shown in FIG. 2B. The curved guide rail 233 can be divided into inner arc region IA and outer arc region OA. The moving part 232 of the adjustment mechanism 23 is arranged in the inner region IA of the curved guide rail 233 of the holder part 231. Through the design of the inner region IA, when the moving part 232 moves on the curved guide rail, the needle tips T2~T4 of the first probing needle 200 are close to a virtual center CO associated with the arc surface formed by the curved guide rail 233 such that the needle tips T2~T4 are maintained to be close to the center CO so as to keep the positions of needle tips in the FOV of the vision identification module 22, thereby preventing the first probing needle 200 from being out of the FOV of the image acquiring module 220 of the vision identification module 22 and reducing the time-consuming issue during adjusting the roll angle so as to improve the efficiency for adjusting the probe tip leveling of the needle tips. On the contrary, in the embodiment shown in FIG. 4B, the needle tips T2~T4 of the probing needle bodies 200*a*~200*c* are located at the outer arc region OA rather the inner arc region IA. Since the needle tips T2~T4 are far away from the virtual center CO, when the moving part 232 on the curved guide rail 233 rotates angle @ and the radius, i.e., distance between the virtual center CO and the needle tips T2~T4 is referred to R, the displacement along the arc direction is equal to RΦ which is greater than the displacement along arc direction shown in FIG. 4A such that the needle tips are out of the FOV of the image acquiring module 220 thereby inducing the time-consuming issue for finding the position of probing needle. It is noted that the embodiment for driving the moving part 232 to move on the curved guide rail 233 shown in FIG. 2B and FIG. 4A is illustrated as FIG. 5, in which the driving element 230*a* is connected to the driving unit 230, and following element 230*b* is connected to the driving element 230*a*. The following element 230*b* is coupled to the moving part 232 through the shaft element 230*c*, wherein the driving element 230*a* receives the driving power outputted from driving unit 230 and drives the rotation of the following element 230*b* such that the moving part 232 is driven to rotate thereby adjusting the position of the first probing base 20*a*. The adjusting result is shown in FIG. 3C in which the roll angle of the needle tips T2~T4 of the plurality of first needle bodies 200*a*~200*c* are adjusted. In one embodiment, the driving element 230*a* is worm gear, and the following element 230*b* is gear that is capable of coupled to the worm gear. It is noted that the driving element 230*a*, and the following element 230*b* in the previously described embodiment are one exemplary example for rotating the moving part 232. The one having ordinary skilled in the art can design different ways for rotation of moving part 232; therefore, it is not limited by the embodiments shown in the figures of the present embodiment.

Figure 5:
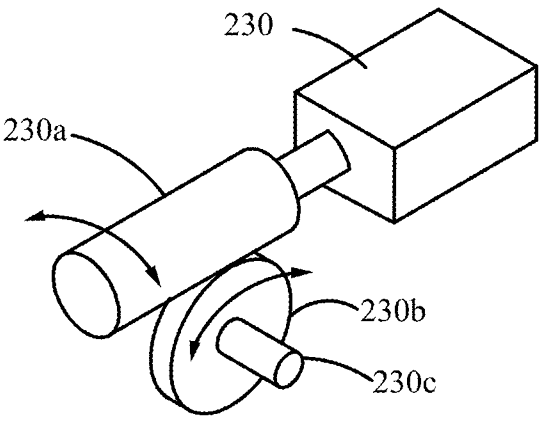
FIG. 5 illustrates adjustment mechanism according to one embodiment of the present invention.
Figure 6A:
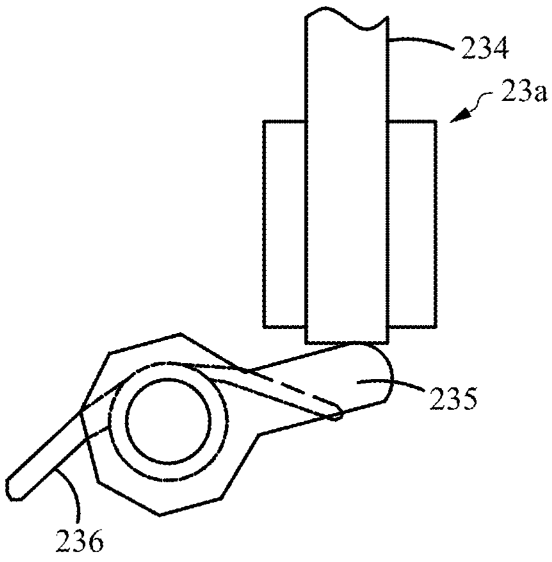
FIGS. 6A and 6B illustrate operation of adjustment mechanism according to another embodiment of the present invention.
Figure 6B:
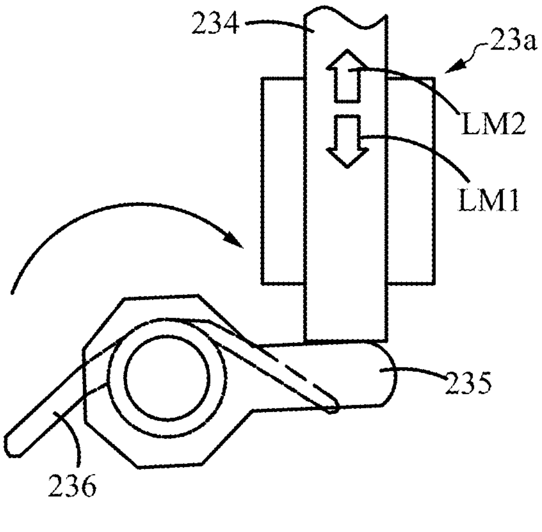

In addition to the adjustment shown in FIG. 4A and FIG. 5, alternatively, please refer to FIGS. 6A and 6B, which illustrate adjustment mechanism according to another embodiment of the present invention. In the present embodiment, the adjustment mechanism 23*a* is directly arranged on the first probing base 20*a* for directly adjusting the roll angle of the needle tips T2~T4 of the first probing base 20*a*. In the embodiment, the adjustment mechanism comprises a driving element 234 and following element 235, wherein the driving element 234 receives power outputted from the driving motor, or receives linear moving power outputted form the linear guide, for example, thereby performing a linear movement LM1 along the first direction, which is along Z axis in the present embodiment. The driving element 234 is worm gear of the present embodiment. The following element 235 contacts with the driving element 235, and the following element 235 is connected to torsion resilient element 236. In the present embodiment, when the driving element 234 performs the linear movement LM1, a reaction force is exerted on the following element 235 by the driving element 234 whereby the following element 235 rotates clockwise so as to rotate the first probing needle 200 thereby adjusting roll angle of the needle tips. When the driving element 234 performs second linear movement LM2 along direction opposite to the first direction, the resilient force is generated to rotates the following element 235 inversely thereby keeping the following element 235 contacting with the driving element 234 such that the first probing needle 200 rotates inversely for adjusting roll angle of the needle tips.

Figure 7:
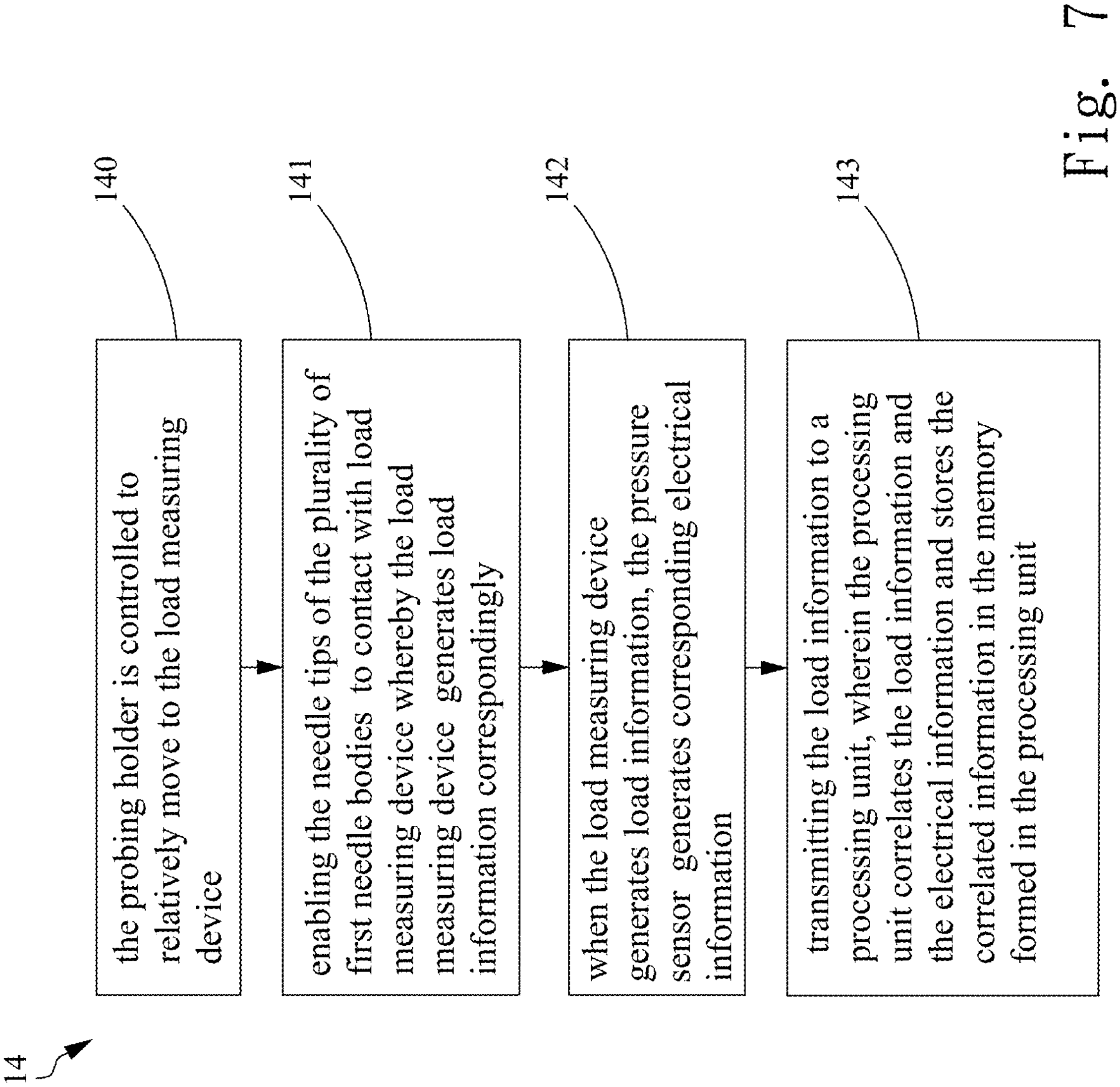
FIG. 7 illustrates a load testing procedure according one embodiment of the present invention.
Figure 8:
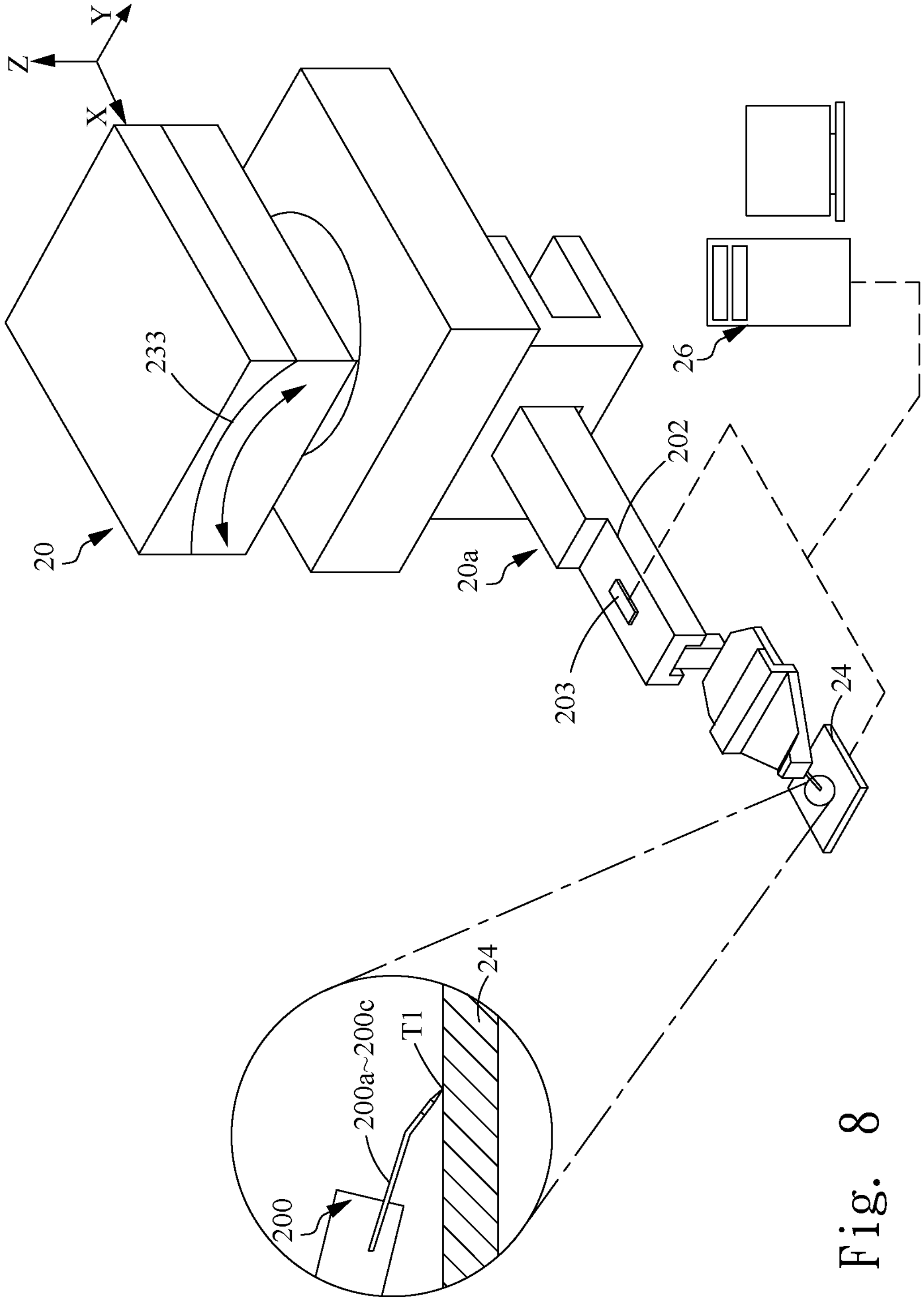
FIG. 8 illustrates one embodiment that the needle tips of the first needle body of the first probing needle grabbed by the probing holder contacts with the load measuring device.

Please refer to FIG. 1 and FIG. 7, which illustrates a load testing procedure according one embodiment of the present invention. After adjusting the roll angle of the needle tips in the step 13, the step 14 for performing a load measuring test with respect to the first probing needle of the first probing base is executed. The purpose for performing the load measuring test is to correctly obtain the load pressure when the first probing needle is moved downwardly to touch the DUT so that the load pressure that the needle tips exert on the DUT will not be exceeded the critical value thereby preventing the probing tips or DUT from being damaged. The FIG. 7 further illustrates load measuring test in the step 14. In order to implemented this step, in the present embodiment such as the example shown in FIG. 2B, the first probing base 20*a* further comprises cantilever arm 202 having pressure sensor 203 formed thereon. In the present embodiment, the cantilever arm further comprises fixed end 202*a* and free end 202*b* wherein the fixed end 202*a* is utilized to fix on a connection base 204 of the first probing base 20*a* and the connection base 204 is connected to the probing holder 21, and the free end 202*b* is connected to a connection structure 200*e* of the first probing needle 200. In the step 14, the load measuring test is explained below. Please refer to FIG. 7, FIG. 2A and FIG. 2B, the step 14 is further started by step 140 in which after the adjustment mechanism 201 is utilized to adjust the roll angle of the first probing base 20*a*, the probing holder 21 is controlled to relatively move to the load measuring device 24. In one embodiment, the load measuring device 24 is arranged on the supporting platform 25 and the relative movement is performed by moving the load measuring device 24 to the position corresponding to the first needle bodies 200*a*~200*c* of the first probing needle 200 grabbed by the probing holder 21 through two-dimensional movement of the supporting platform 25 on plane defined by XY axes. In another alternative embodiment, the probing holder 21 is controlled to move two-dimensionally so as to change the relative position between probing holder 21 and load measuring device 24. In other alternative embodiment, the probing holder 21 and the supporting platform 25 can both two-dimensionally move on the plane defined by XY axes so as to adjust the relative position between probing holder 21 and load measuring device 24. Thereafter, a step 141 is performed to enable the needle tips T1 of the plurality of first needle bodies 200*a*~200*c* to contact with load measuring device 24 whereby the load measuring device 24 generates load information correspondingly. Please refer to FIG. 8, after the first needle bodies 200*a*~200*c* of the first probing needle 200 grabbed by the probing holder 21 are moved to the position corresponding to the load measuring device 24, the probing holder 21 is move downwardly along-Z axis whereby the needle tips T1 of the first needle bodies 200*a*~200*c* can touch the surface of the load measuring device 24.

Please refer back to FIG. 7 and FIG. 8, a step 142 is performed after step 141, in which when the load measuring device 24 generates load information, the pressure sensor 203 generates corresponding electrical information. After that, a step 143 is performed by transmitting the load information and electrical information to a processing unit 26, such as computer, server, or workstation, electrically coupled to the pressure sensor 203 and load measuring device 24, whereby the processing unit 26 correlates the load information and the electrical information and stores the correlated information in the memory formed in the processing unit 26. It is noted that the steps 142~143 can be repeated by controlling the probing holder 21 to touch the load measuring device 24 several times, each of which is corresponding to different load pressures exerting on the load measuring device 24 thereby generating a plurality of load values respectively corresponding to a plurality of electrical information generated by pressure sensor 203. Since the processing unit 26 stores correlated information with respect to the electrical information and load information, when the first probing needle contacts the contact pad during the real electrical test on the DUT, the load information exerting on the control pad can be determined by using the sensed electrical information detected pressure sensor 203. This can be a standard for controlling the load pressure exerting on the contact pad so as to prevent the load pressure from being exceeded a threshold value. Please refer back to FIG. 1, after load measuring test, a step 15 is performed to enable a relative movement between the probing holder 21 and the supporting platform 25 so as to move the probing holder 21 in the testing area TA such that the first probing needle 200 can be controlled to proceed the electrical test on the DUT(S) in the testing area TA.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for adjusting position of probing base, comprising steps of:

providing a probing machine comprising a probing holder, a first probing base, and a second probing base, wherein the first probing base and the second probing base are positioned in a probing base placing part, the first probing base comprises a first probing needle comprising a plurality of first probing needle bodies, wherein needle tips of two adjacent first probing needle bodies have a first pitch, and the second probing base comprises a second probing needle comprising a plurality of second probing needle bodies, wherein needle tips of two adjacent second probing needle bodies have a second pitch;

connecting the probing holder to the first probing base when the first probing base is grabbed;

enabling a relative motion between a vision identification module and the probing holder such that the probing holder is moved within the field of view of the vision identification module, and a first image with respect to the plurality of the first probing needle bodies is captured through the vision identification module wherein the needle tips of the plurality of first probing needle bodies are captured within the first image; and adjusting position of the first probing base according to the first image such that a roll angle of the needle tips of the plurality of first probing needle bodies is adjusted.

2. The method of claim 1, wherein the probing machine further comprises a load measuring device for performing a step of load measuring test, which comprises steps of:

relatively moving the probing holder to the load measuring device after adjusting the roll angle of the needle tips of the plurality of first probing needle bodies using an adjustment mechanism, and moving the needle tips of the plurality of first needle bodies to contact with the load measuring device thereby generating a load information by the load measuring device.

3. The method of claim 2, wherein the first probing base further comprises a cantilever arm having a pressure sensor formed thereon, and the load measuring test further comprises steps of:

generating an electrical information by the pressure sensor when the load measuring device generates the load information;

transmitting the load information and the electrical information to a processing unit electrically coupled to the pressure sensor and the load measuring device; and correlating the load information with the electrical information by the processing unit.

4. The method of claim 2, wherein the step of providing the probing machine further comprises steps of:

providing a supporting platform on which the probing base placing part and the vision identification module are arranged, wherein the supporting platform further comprises a testing area for placing a device under test, and the load measuring device is arranged in the probing base placing part or is arranged between the probing base placing part and the testing area.

5. The method of claim 1, wherein the step for adjusting position of the first probing base further comprises step of moving the first probing base along a curved surface, wherein the plurality of first needle bodies are located within an inner arc region of the curved surface.

6. The method of claim 1, further comprising a step of rotating the first probing base by a specific angle after the first probing base is connected to the probing holder such that the first probing base is in an imaging field of the vision identification module.

7. A probing machine having position-adjustable probing holder, comprising:

a probing base placing part, configured to accommodate a first probing base and a second probing base, wherein the first probing base comprises a first probing needle comprising a plurality of first needle bodies, and needle tips of two adjacent first needle bodies have a first pitch, and the second probing base comprises a second probing needle comprising a plurality of second needle bodies, and needle tips of two adjacent second needle bodies have a second pitch;

a probing holder, configured to connect to a first probing base for detecting an electrical characteristic of a device under test;

a vision identification module, configured to acquire a first image corresponding to needle tips of the plurality of first needle bodies of the first probing base after the probing holder is connected to the first probing base, and configured to generate a control signal according to the first image; and an adjustment mechanism, configured to receive the control signal for adjusting a roll angle with respect to the needle tips of the plurality of first needle bodies of the first probing base.

8. The probing machine of claim 7, further comprising a load measuring device for generating a load information when the plurality of first needle bodies are moved to contact the load measuring device after the of the needle tips of the plurality of first probing needle bodies is adjusted by the adjustment mechanism.

9. The probing machine of claim 8, wherein the first probing base further comprises a cantilever arm having a pressure sensor formed thereon wherein the pressure sensor generates an electrical information when the load measuring device generates the load information, and a processing unit receives the load information and the electrical information and correlates the load information with the electrical information.

10. The probe machine of claim 8, further comprising a supporting platform on which the probing base placing part and the vision identification module are arranged, wherein the platform further comprises a testing area for placing the device under test, and the load measuring device is arranged in the probing base placing part or is arranged between the probing base placing part and the testing area.

11. The probing machine of claim 7, wherein the adjustment mechanism is arranged on the first probing base, and the adjustment mechanism further comprises:

a driving unit;

a holding part, arranged on the probing holder, and configured to have a curved guide rail formed thereon; and a moving part, configured to have a first side slidably arranged on an inner area of the curved guide rail, and a second side connected to the first probing base, the moving part coupled to driving unit and sliding on the curved guide rail by power outputted from the driving unit thereby adjusting position of the first probing base.

12. The probing machine of claim 7, wherein the vision identification module further comprises:

an image acquiring module, configured to acquire the first image of the needle tips; and an identification module, electrically connected to the image acquiring module and the adjustment mechanism, the identification module receiving the first image, and generating the control signal through identifying a bias angle of the needle tips of the first needle bodies according to the first image.

* * * * *